(12) United States Patent
Park et al.

(10) Patent No.: US 12,193,158 B2
(45) Date of Patent: Jan. 7, 2025

(54) PRINTED CIRCUIT BOARD MODULE

(71) Applicant: LG INNOTEK CO., LTD., Seoul (KR)

(72) Inventors: Jeong Heum Park, Seoul (KR); Soo Hong Kim, Seoul (KR); Kwang Soon Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 188 days.

(21) Appl. No.: 17/782,255

(22) PCT Filed: Dec. 4, 2020

(86) PCT No.: PCT/KR2020/017693
§ 371 (c)(1),
(2) Date: Jun. 3, 2022

(87) PCT Pub. No.: WO2021/118176
PCT Pub. Date: Jun. 17, 2021

(65) Prior Publication Data
US 2023/0010263 A1    Jan. 12, 2023

(30) Foreign Application Priority Data
Dec. 11, 2019  (KR) ........................ 10-2019-0164899

(51) Int. Cl.
*H05K 1/14*    (2006.01)
*H01F 17/00*   (2006.01)
(Continued)

(52) U.S. Cl.
CPC ......... *H05K 1/144* (2013.01); *H01F 17/0013* (2013.01); *H05K 1/05* (2013.01);
(Continued)

(58) Field of Classification Search
CPC .......... H05K 1/144; H05K 1/05; H05K 1/145; H05K 2201/041; H01F 17/0013
See application file for complete search history.

(56) References Cited

U.S. PATENT DOCUMENTS 7,248,138 B2    7/2007  Chiang et al.
2004/0201134 A1  10/2004  Kawai et al.
(Continued)

FOREIGN PATENT DOCUMENTS

CN     106211572 A    12/2016
CN     207340272 U     5/2018
(Continued)

*Primary Examiner* — Hoa C Nguyen
(74) *Attorney, Agent, or Firm* — Birch, Stewart, Kolasch & Birch, LLP

(57) ABSTRACT

A printed circuit board module comprises: a first printed circuit board; a second printed circuit board arranged on one surface of the first printed circuit board; a third printed circuit board arranged on the other surface of the first printed circuit board; and a core passing through the first printed circuit board to the third printed circuit board, wherein the second printed circuit board includes a first coil, the third printed circuit board includes a second coil, and the cross-sectional area of the second printed circuit board and the third printed circuit board is less than the cross-sectional area of the first printed circuit board.

11 Claims, 10 Drawing Sheets

(51) Int. Cl.
  *H05K 1/05* (2006.01)
  *H05K 1/16* (2006.01)
(52) U.S. Cl.
  CPC ............ *H05K 1/145* (2013.01); *H05K 1/165* (2013.01); *H05K 2201/041* (2013.01)

(56) References Cited

U.S. PATENT DOCUMENTS

| | | | |
|---|---|---|---|
| 2010/0219926 A1* | 9/2010 | Willers | H01F 27/06 336/200 |
| 2014/0266554 A1 | 9/2014 | Sun et al. | |
| 2017/0156210 A1 | 6/2017 | Kegeler | |
| 2021/0185817 A1* | 6/2021 | Fujii | H01F 27/40 |

FOREIGN PATENT DOCUMENTS

| | | |
|---|---|---|
| DE | 10 2007 019 111 A1 | 10/2008 |
| JP | 5-159951 A | 6/1993 |
| JP | 2000-91138 A | 3/2000 |
| JP | 2001-358427 A | 12/2001 |
| JP | 2007-59845 A | 3/2007 |
| JP | 2008-300734 A | 12/2008 |
| JP | 2009-259922 A | 11/2009 |
| JP | 2013-62355 A | 4/2013 |
| JP | 2014-75535 A | 4/2014 |
| JP | 2015-133440 A | 7/2015 |
| KR | 2001-0114120 A | 12/2001 |
| KR | 10-1251843 B1 | 4/2013 |
| KR | 10-1365393 B1 | 2/2014 |
| KR | 10-1562742 B1 | 10/2015 |
| KR | 10-2017-0022670 A | 3/2017 |
| WO | WO 2016/158064 A1 | 10/2016 |

* cited by examiner

PRINTED CIRCUIT BOARD MODULE

CROSS REFERENCE TO RELATED APPLICATIONS

This application is the National Phase of PCT/KR2020/017693 filed on Dec. 4, 2020, which claims priority under 35 U.S.C. § 119 (a) to Patent Application No. 10-2019-0164899 filed in the Republic of Korea on Dec. 11, 2019, all of which are hereby expressly incorporated by reference into the present application.

TECHNICAL FIELD

The present embodiment relates to a printed circuit board module.

BACKGROUND ART

The content described below provides background information on the present embodiment and does not describe the prior art.

As electric devices of automobiles, engine electric devices (starting device, ignition device, and charging device) and lighting device are common, but in recent years, as vehicles are more electronically controlled, most systems including chassis electric devices are becoming electric and electronic.

Various electric components such as lamps, audio, heaters, and air conditioners installed in automobiles receive power from the battery when the car is stopped and receive power from the generator when driving, and at this time, the power generation capacity of the 14V power system is used as a normal power supply voltage.

Recently, along with the development of the information technology industry, various new technologies (motorized power steering, Internet, and the like) for the purpose of increasing the convenience of automobiles are being adopted to vehicles, and in the future, it is expected that the development of new technologies that can utilize the current automobile system to the maximum will continue.

A hybrid electric vehicle (HEV), regardless of soft or hard type, is equipped with a DC-DC converter for supplying an electric load (12V). In addition, the DC-DC converter, which acts as a generator (alternator) of a general gasoline vehicle, supplies a voltage of 12V for the electric load by reducing the high voltage of the main battery (usually a high-voltage battery of 144V or more).

A DC-DC converter refers to an electronic circuit device that converts DC power of a certain voltage to DC power of another voltage, and is used in various fields such as television sets and automobile electronic products.

The outer appearance of a converter may be formed by the housing. A plurality of components for driving may be disposed inside the housing. The plurality of components may include a printed circuit board. One or more electronic components for driving may be disposed on an upper surface or a lower surface of the printed circuit board. For example, the electronic components may include an inductor and a transformer.

Since these power devices are comprised of a wire-wound element through an iron core and a core, there is a problem in that the overall height of the component is higher than that of other components, thereby narrowing the space inside the housing.

Specifically, there is a problem in that the manufacturing cost of the module increases when the printed circuit board is configured in multiple layers because the coil arrangement area is limited for each layer of the printed circuit board. In addition, since the capacitance component increases due to the increase of the coil arrangement area, resonance with the parasitic component is generated, there is a disadvantage in terms of electromagnetic waves. In addition, since it includes a high magnetic coupling through the core, there is a problem in that it is difficult to secure the leakage inductor.

DETAILED DESCRIPTION OF THE INVENTION

Technical Subject

An objective of the present embodiment is to provide a printed circuit board module that can secure a wider space inside the housing by miniaturizing components.

Technical Solution

As an embodiment, a printed circuit board module comprises: a first printed circuit board; a second printed circuit board arranged on one surface of the first printed circuit board; a third printed circuit board arranged on the other surface of the first printed circuit board; and a core passing through the first printed circuit board to the third printed circuit board, wherein the second printed circuit board includes a first coil, the third printed circuit board includes a second coil, and the cross-sectional area of the second printed circuit board and the third printed circuit board is less than the cross-sectional area of the first printed circuit board.

In addition, the first printed circuit board may include a first hole and a second hole into which a part of the core is inserted.

In addition, the second printed circuit board may be disposed between the first hole and the second hole.

In addition, the first coil may include a plurality of first metal patterns, and the second coil may include a plurality of second metal patterns.

In addition, the core may include a first core and a second core, the first core may penetrate through the first printed circuit board, and the second core may penetrate through the second printed circuit board.

In addition, each of the first core and the second core may be disposed in plurality.

In addition, an insulation layer may be included between the first printed circuit board and the second printed circuit board or between the first printed circuit board and the third printed circuit board.

In addition, the insulation layer may include an air gap.

In addition, the first core may be in contact with an upper surface and a side surface of the second printed circuit board, and the second core may contact a lower surface and a side surface of the third printed circuit board.

In another embodiment, the printed circuit board module comprises: a first printed circuit board having a first opening; a second printed circuit board disposed on one surface of the first printed circuit board and having a second opening; a third printed circuit board disposed on the other surface of the first printed circuit board and having a third opening; and a core, at least a portion of which passes through the second opening and the third opening, wherein the second printed circuit board and the third printed circuit board include a coil, and the length of a long side of the core is longer than the length of at least one side of the second printed circuit board or the third printed circuit board.

Advantageous Effects

According to the present invention, there are advantages in that a wide space for forming a metal pattern can be secured by configuring the second printed circuit board in multiple layers in addition to the main printed circuit board, and the manufacturing cost can be lowered when compared to configuring the main printed circuit board in multiple layers.

BEST MODE

Figure 1:
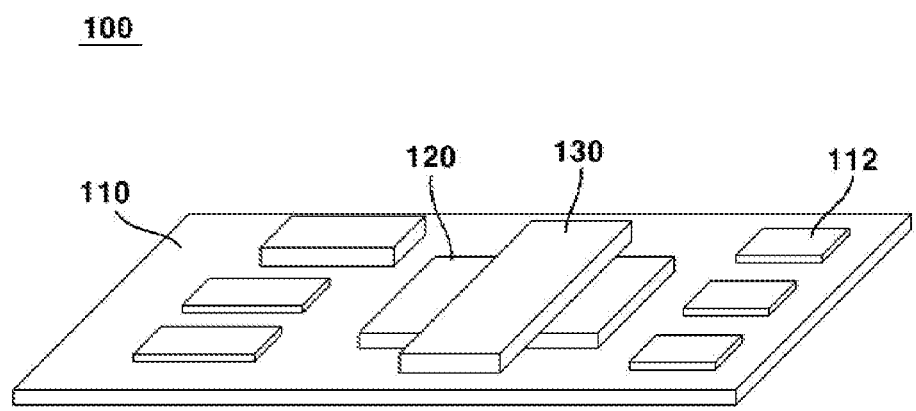
FIG. 1 is a perspective view of a printed circuit board module according to a first embodiment of the present invention.

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

A converter according to the present embodiment is an electronic device provided in a vehicle, and refers to an electronic circuit device that converts power of a certain voltage to power of another voltage. For example, the converter may be a DC-DC converter. However, the configuration according to the present embodiment is not limited thereto, and the printed circuit board module according to the present embodiment can be applied to various electronic devices.

In addition, the outer appearance of the converter according to the present embodiment can be formed by the housing. An inner space may be formed inside the housing so that the printed circuit board module according to the present embodiment is disposed.

Figure 2:
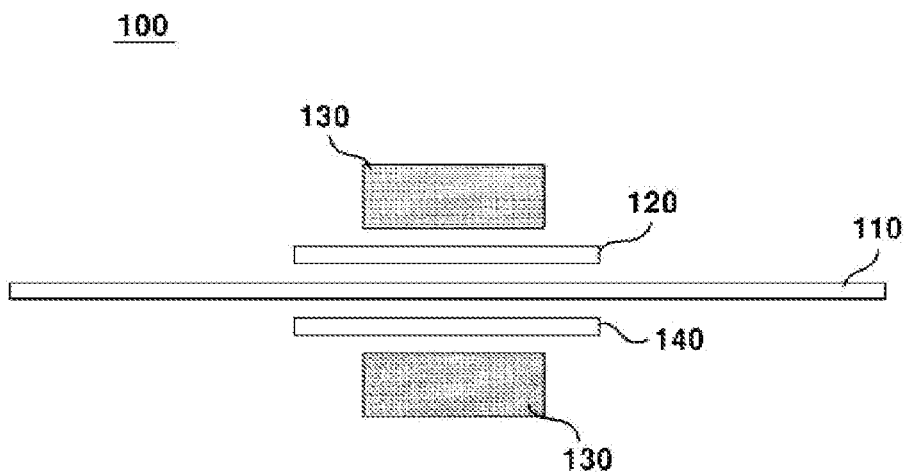
FIG. 2 is a cross-sectional view of a printed circuit board module according to a first embodiment of the present invention.
Figure 3:
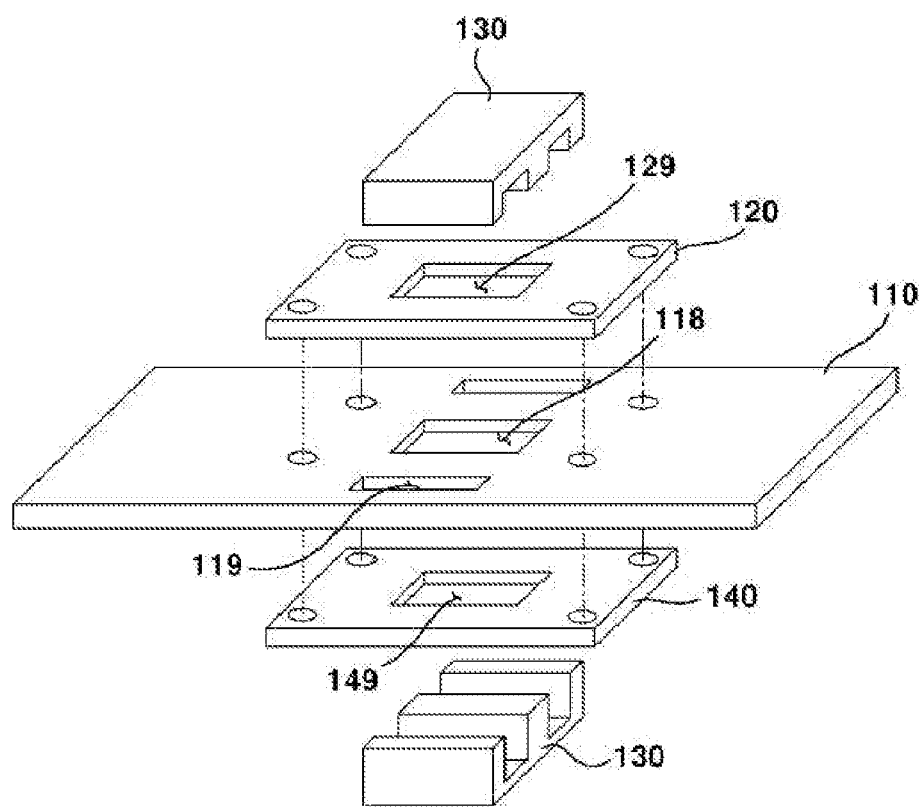
FIG. 3 is an exploded perspective view of a printed circuit board module according to a first embodiment of the present invention.
Figure 4:
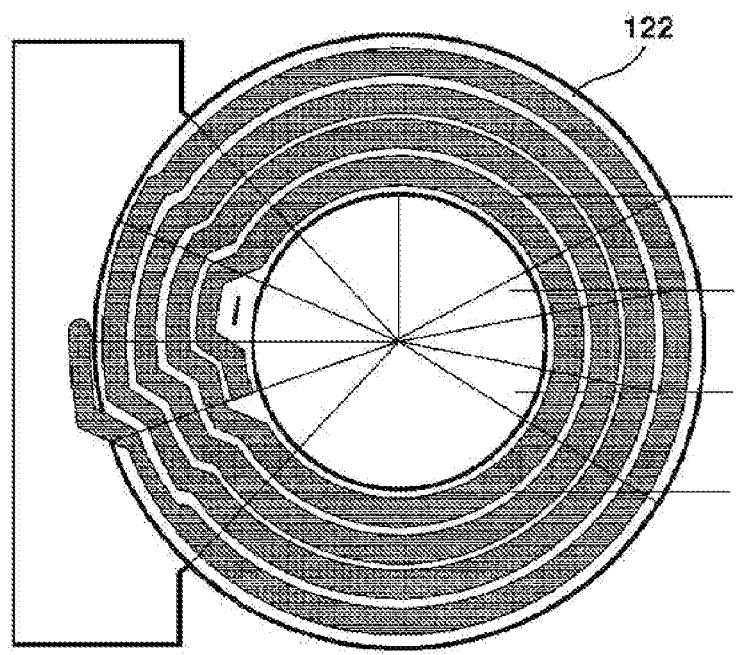
FIG. 4 is a plan view of a metal pattern according to a first embodiment of the present invention.

FIG. 1 is a perspective view of a printed circuit board module according to a first embodiment of the present invention; FIG. 2 is a cross-sectional view of a printed circuit board module according to a first embodiment of the present invention; FIG. 3 is an exploded perspective view of a printed circuit board module according to a first embodiment of the present invention; and FIG. 4 is a plan view of a metal pattern according to a first embodiment of the present invention.

Referring to FIGS. 1 to 4, the printed circuit board module 100 according to the first embodiment of the present invention may include: a first printed circuit board 110, a second printed circuit board 120, and a core 130.

The first printed circuit board 110 may be formed in a plate shape. One or more electronic components 112 for driving may be disposed on an upper surface or a lower surface of the first printed circuit board 110. The electronic components 112 may be provided in plurality and disposed to be spaced apart from each other.

The first printed circuit board 110 is comprised of a double-sided printed circuit board, and the second printed circuit boards 120 and 140, the core 130 and a plurality of electronic components 112 may be disposed on an upper surface and a lower surface, respectively.

A primary metal pattern (not shown) may be wound on an upper surface or a lower surface of the first printed circuit board 110. The first metal pattern may be formed in a coil shape on a surface of the first printed circuit board 110.

Second printed circuit boards 120 and 140 may be disposed on one surface or the other surface of the first printed circuit board 110. The second printed circuit boards 120 and 140 may include: an upper printed circuit board 120 disposed on an upper surface of the first printed circuit board 110; and a lower printed circuit board 140 disposed on a lower surface of the first printed circuit board 110. The cross-sectional area of the second printed circuit boards 120 and 140 may be formed to be smaller than that of the first printed circuit board 110.

The upper printed circuit board 120 is a second printed circuit board 120, and the lower printed circuit board 140 may be referred to as a third printed circuit board 140. The second printed circuit board 120 and the third printed circuit board 140 may have the same area.

A secondary metal pattern 122 may be wound on a surface of the second printed circuit boards 120 and 140. The secondary metal pattern may be wound in the form of a coil on a surface of the second printed circuit boards 120 and 140.

In other words, a first coil may be formed on the second printed circuit board 120, and a second coil may be formed on the third printed circuit board 140. The first coil may include a plurality of first metal patterns. The second coil may include a plurality of second metal patterns.

The first metal pattern may include a primary coil having a first voltage. The second metal pattern may include a secondary coil having a second voltage being separated from the primary coil.

As illustrated in FIG. 3, the primary metal pattern or the secondary metal pattern 122 may be formed in the form of a spiral on the surface of the first printed circuit board 110 or the second printed circuit boards 120 and 140, respectively.

The second printed circuit boards 120 and 140 may be formed in multiple layers. The upper printed circuit board 120 and the lower printed circuit board 140 are provided in plurality, respectively, and may be stacked in a vertical direction. More specifically, the upper printed circuit board 120 disposed on the first printed circuit board 110 may be implemented in two or more sheets. In addition, the secondary metal pattern 122 may be disposed on a surface of each of the upper printed circuit boards 120.

When the second printed circuit boards 120 and 140 are implemented as multiple layers, the metal patterns disposed on a surface of the second printed circuit boards 120 and 140 may be connected with a conductor through a through hole.

On the other hand, in the present embodiment, the first metal pattern is disposed on the first printed circuit board 110 and the second metal pattern is disposed on the second printed circuit boards 120 and 140 as an example, but is not limited thereto, and a primary metal pattern may be disposed on the second printed circuit boards 120 and 140, and a secondary metal pattern may be disposed on the first printed circuit board 110. In addition, the metal pattern may not be disposed on the first printed circuit board 110 at all. In this case, both the primary metal pattern and the secondary metal pattern may be disposed on the second printed circuit boards 120 and 140.

Meanwhile, the primary metal pattern and the secondary metal pattern may be implemented as metal pattern layers having an inductance component on the first printed circuit board 110 and the second printed circuit boards 120 and 140, respectively. In addition, the metal pattern layer having an inductance component may be provided with a metal material having high conductivity to efficiently and smoothly output the transformed power signal.

The core 130 may be coupled to penetrate the first to third printed circuit boards 110, 120, and 140. A first opening 118 and a hole 119 may be formed in the first printed circuit board 110 for being inserted with at least a portion of the core 130. A plurality of the holes 119 may be provided to face each other with respect to the first opening 118. The hole 119 may include a first hole and a second hole. At least a portion of the core 130 may be inserted into the first hole and the second hole, respectively.

The second printed circuit board 120 and the third printed circuit board 140 may be disposed between the first hole and the second hole.

The cross-sectional area of the hole 119 may be formed to be smaller than the cross-sectional area of the first opening 118.

Meanwhile, among the second printed circuit board 120 and the third printed circuit board 140, in an area facing the first opening 118 in the vertical direction, a second opening 129 and a third opening 149 may be formed, respectively. Due to this, at least a portion of the core 130 may be coupled to penetrate through the first opening 118, the second opening 129, and the third opening 149. The first to third openings 118, 129, and 149 may be disposed to face each other in the vertical direction, and may have the same size.

The core 130 may be disposed on the surfaces of the second printed circuit boards 120 and 140 to induce the formation of a magnetic field. The core 130 may be disposed on an upper surface of the upper printed circuit board 120 or a lower surface of the lower printed circuit board 140. The core 130 may have a shape that surrounds the first printed circuit board 110 and the second printed circuit boards 120 and 140 that form the primary metal pattern and the secondary metal pattern from the outside. The metal pattern 122 disposed on the surfaces of the second printed circuit boards 120 and 140 may be disposed to surround the core 130. For example, the core 130 may be a ferrite core.

The core 130 may be provided in plurality. The core 130 may include a first core and a second core. The first core may be in contact with an upper surface and a side surface of the second printed circuit board 120. The second core may in contact with a lower surface and a side surface of the third printed circuit board 140.

Figure 10:
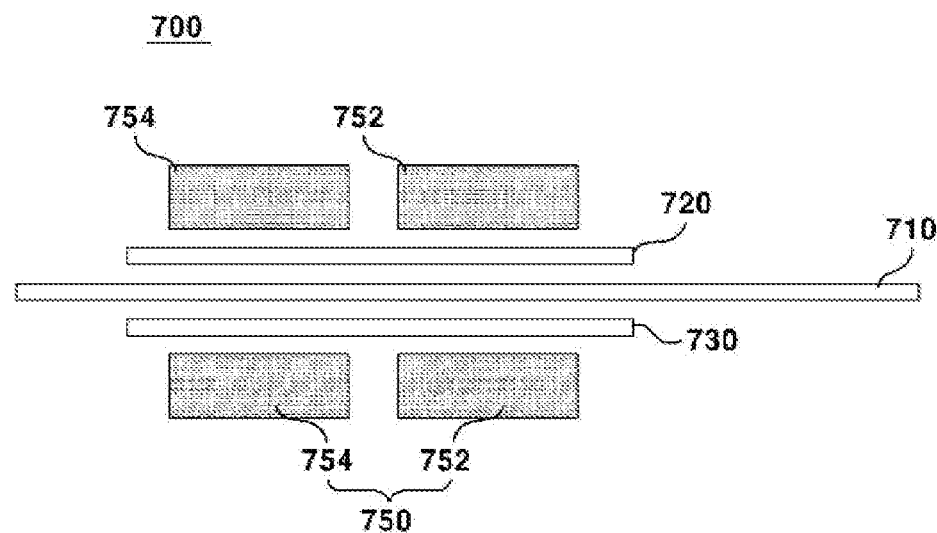
FIG. 10 is a cross-sectional view of a printed circuit board module according to a seventh embodiment of the present invention.

Each of the first core and the second core may be disposed in plurality (refer to FIG. 10).

Meanwhile, the length of the long side of the core 130 may be formed to be longer than the length of at least one side of the second printed circuit board 120 or the third printed circuit board 130.

According to the above structure, a space for forming a metal pattern can be secured by configuring the second printed circuit board in multiple layers in addition to the main printed circuit board, and there is an advantage in that the manufacturing cost can be lowered when compared to configuring the main printed circuit board to have a multi-layer structure.

Figure 5:
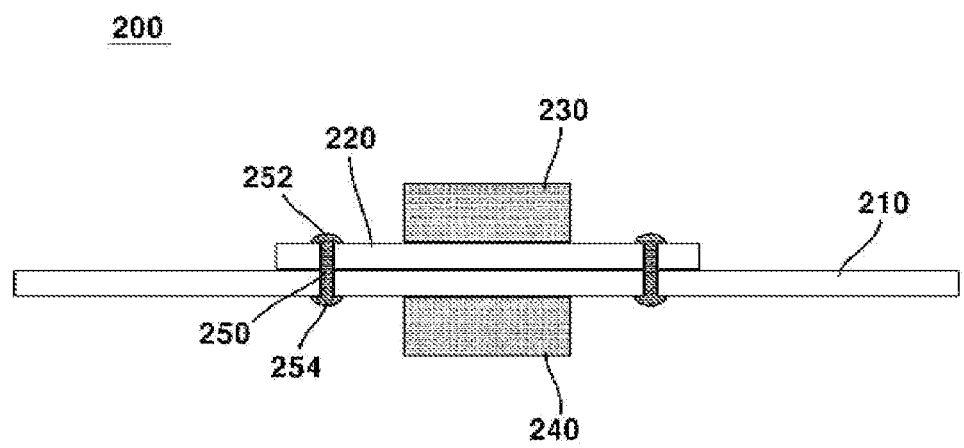
FIG. 5 is a cross-sectional view of a printed circuit board module according to a second embodiment of the present invention.

FIG. 5 is a cross-sectional view of a printed circuit board module according to a second embodiment of the present invention.

Referring to FIG. 5, a printed circuit board module 200 according to a second embodiment of the present invention may include a first printed circuit board 210, a second printed circuit board 220, an upper core 230, and a lower core 240.

The first printed circuit board 210 may be formed in a plate shape. One or more electronic components for driving may be disposed on an upper surface or a lower surface of the first printed circuit board 210. The electronic components may be provided in plurality and disposed to be spaced apart from each other.

The first printed circuit board 210 is comprised of a double-sided printed circuit board, and the second printed circuit board 220, the cores 230 and 240, and a plurality of electronic components may be disposed on an upper surface and a lower surface, respectively.

A primary metal pattern (not shown) may be wound on an upper surface or a lower surface of the first printed circuit board 210. The first metal pattern may be formed in a coil shape on a surface of the first printed circuit board 210.

A second printed circuit board 220 may be disposed on the upper surface of the first printed circuit board 210. The cross-sectional area of the second printed circuit board 220 may be formed to be smaller than the cross-sectional area of the first printed circuit board 210.

A secondary metal pattern may be wound on a surface of the second printed circuit board 220. The secondary metal pattern may be wound on a surface of the second printed circuit board 220 in the form of a coil. The secondary metal pattern may be formed in the form of a spiral on the surface of the second printed circuit board 220.

The second printed circuit board 220 may be formed in multiple layers. The second printed circuit board 220 disposed on the second printed circuit board 220 may be implemented in two or more sheets. In addition, the secondary metal pattern may be disposed on a surface of each of the second printed circuit boards 220.

When the second printed circuit board 220 is implemented as a multi-layer, a conductor may be connected between the metal patterns disposed on a surface of the second printed circuit board 220 through a through hole.

The upper core 230 may be disposed on an upper surface of the second printed circuit board 220. The upper core 230 may be disposed on a surface of the second printed circuit board 220 to induce the formation of a magnetic field. The upper core 230 may be coupled to surround the secondary metal pattern from the outside.

The upper core 230 may be coupled to penetrate the second printed circuit board 220.

The lower core 240 may be disposed on a lower surface of the first printed circuit board 210. The lower core 240 may be disposed on a lower surface of the first printed circuit board 210 to induce the formation of a magnetic field. The lower core 240 may be coupled to surround the primary metal pattern from the outside.

The lower core 240 may be coupled to penetrate the first printed circuit board 110.

The upper core 230 and the lower core 240 may be ferrite cores.

The first printed circuit board 210 and the second printed circuit board 220 may be rivet-coupled to each other. A hole may be formed in each of the first printed circuit board 210 and the second printed circuit board 220 so that a rivet 250 penetrates therethrough, respectively. On the upper and lower ends of the rivet 250, locking portions 252 and 254 being formed to have a larger cross-sectional area than that of other areas may be formed so as to be caught on the lower surface of the first printed circuit board 210 and the upper surface of the second printed circuit board 220, respectively. According to the structure as described above, the coupling state of the first printed circuit board 210 and the second printed circuit board 220 may be firmly fixed.

In addition, the first printed circuit board 210 and the second printed circuit board 220 may be electrically connected through the rivet 250. In this case, the upper and lower ends of the rivet 250 may be mounted on a lower surface of the first printed circuit board 210 or an upper surface of the second printed circuit board 220, respectively.

Figure 6:
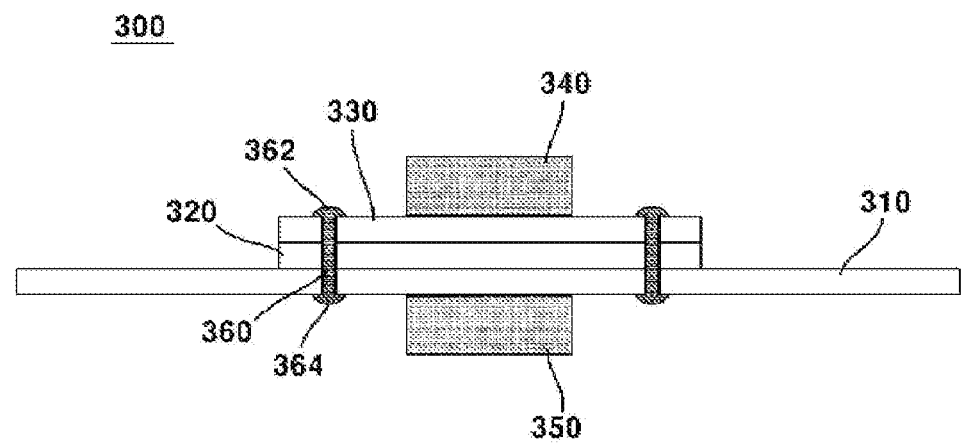
FIG. 6 is a cross-sectional view of a printed circuit board module according to a third embodiment of the present invention.

FIG. 6 is a cross-sectional view of a printed circuit board module according to a third embodiment of the present invention.

Referring to FIG. 6, the printed circuit board module 300 according to the third embodiment of the present invention may comprise a first printed circuit board 310, a second printed circuit board 320, a third printed circuit board 330, an upper core 340, and a lower core 350.

The first printed circuit board 310 may be formed in a plate shape. One or more electronic components for driving may be disposed on an upper surface or a lower surface of the first printed circuit board 310. The electronic components may be provided in plurality and disposed to be spaced apart from each other.

The first printed circuit board 310 is comprised of a double-sided printed circuit board, and a second printed circuit board 320, a lower core 350, and a plurality of electronic components may be disposed on an upper surface and a lower surface, respectively.

A primary metal pattern (not shown) may be wound on an upper surface or a lower surface of the first printed circuit board 310. The first metal pattern may be formed in a coil shape on a surface of the first printed circuit board 310.

A second printed circuit board 320 may be disposed on the upper surface of the first printed circuit board 310. The cross-sectional area of the second printed circuit board 320 may be formed to be smaller than the cross-sectional area of the first printed circuit board 310.

A secondary metal pattern may be wound on a surface of the second printed circuit board 320. The secondary metal pattern may be wound on a surface of the second printed circuit board 320 in the form of a coil. The secondary metal pattern may be formed in the form of a spiral on the surface of the second printed circuit board 320.

The second printed circuit board 320 may be formed in multiple layers. The second printed circuit board 320 disposed on the second printed circuit board 320 may be implemented in two or more sheets. In addition, the secondary metal pattern may be disposed on a surface of each of the second printed circuit boards 320.

When the second printed circuit board 320 is implemented as a multi-layer, a conductor may be connected between the metal patterns disposed on a surface of the second printed circuit board 320 through a through hole.

A third printed circuit board 330 may be disposed on an upper surface of the second printed circuit board 320. A cross-sectional area of the third printed circuit board 330 may be formed to be smaller than a cross-sectional area of the first printed circuit board 310. A cross-sectional area of the third printed circuit board 330 may correspond to a cross-sectional area of the second printed circuit board 320.

A secondary metal pattern may be wound on a surface of the third printed circuit board 330. The secondary metal pattern may be wound on a surface of the third printed circuit board 330 in the form of a coil. The secondary metal pattern may be formed in the form of a spiral on the surface of the third printed circuit board 330.

The third printed circuit board 330 may be formed in multiple layers. The third printed circuit board 330 disposed on the third printed circuit board 330 may be implemented in two or more sheets. In addition, the secondary metal pattern may be disposed on a surface of each of the third printed circuit boards 330.

When the third printed circuit board 330 is implemented as a multi-layer, a conductor may be connected between the metal patterns disposed on a surface of the third printed circuit board 330 through a through hole.

In addition, the metal pattern of the third printed circuit board 330 and the metal pattern of the second printed circuit board 320 may be interconnected by a conductor through a through hole.

The upper core 340 may be disposed on an upper surface of the third printed circuit board 330. The upper core 340 may be disposed on a surface of the third printed circuit board 330 to induce the formation of a magnetic field. The upper core 340 may be coupled to surround the secondary metal pattern from the outside.

The lower core 350 may be disposed on a lower surface of the first printed circuit board 310. The lower core 350 may be disposed on a lower surface of the first printed circuit board 310 to induce the formation of a magnetic field. The lower core 350 may be coupled to surround the primary metal pattern from the outside.

The upper core 340 and the lower core 350 may be ferrite cores.

The first printed circuit board 310, the second printed circuit board 320, and the third printed circuit board 330 may be rivet-coupled to each other. Holes may be formed in the first printed circuit board 310, the second printed circuit board 320, and the third printed circuit board 330 so that a rivet 360 penetrates therethrough, respectively. On the upper and lower ends of the rivet 360, locking portions 362 and 364 being formed to have a larger cross-sectional area than that of other areas may be formed so as to be caught on the lower surface of the first printed circuit board 310 and the upper surface of the third printed circuit board 330, respectively. According to the structure as described above, the coupling state of the first printed circuit board 310, the second printed circuit board 320, and the third printed circuit board 330 can be firmly fixed.

In addition, the first printed circuit board 310 and the second printed circuit board 320 and the third printed circuit board 330 may be electrically connected through the rivet 360. In this case, the upper and lower ends of the rivet 360 may be mounted on a lower surface of the first printed circuit board 310 or an upper surface of the third printed circuit board 330, respectively.

Figure 7:
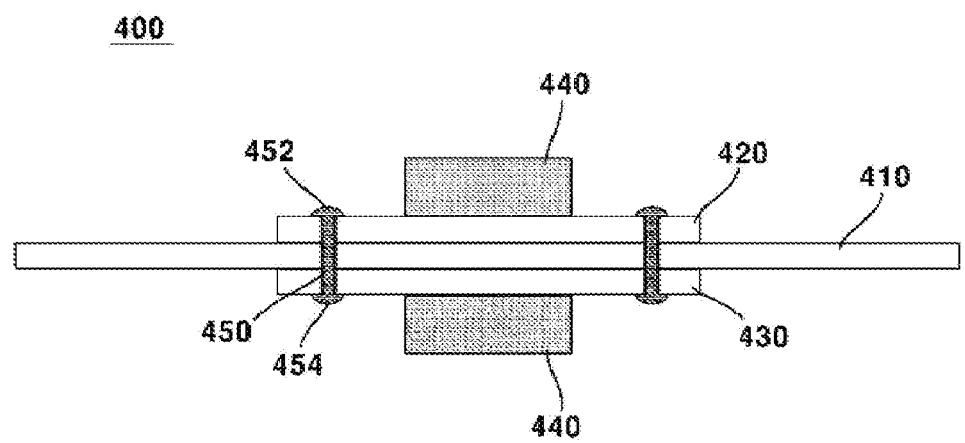
FIG. 7 is a cross-sectional view of a printed circuit board module according to a fourth embodiment of the present invention.

FIG. 7 is a cross-sectional view of a printed circuit board module according to a fourth embodiment of the present invention.

Referring to FIG. 7, the printed circuit board module 400 according to a fourth embodiment of the present invention may include a first printed circuit board 410, a second printed circuit board 420, a third printed circuit board 430, and a core 440.

The first printed circuit board 410 may be formed in a plate shape. One or more electronic components for driving may be disposed on an upper surface or a lower surface of the first printed circuit board 410. The electronic components may be provided in plurality and disposed to be spaced apart from each other.

The first printed circuit board 410 is comprised of a double-sided printed circuit board, and the second printed circuit board 420 and the third printed circuit board 430 may be disposed on an upper surface and a lower surface, respectively.

A primary metal pattern (not shown) may be wound on an upper surface or a lower surface of the first printed circuit board 410. The primary metal pattern may be formed in a coil shape on a surface of the printed circuit board 410.

A second printed circuit board 420 may be disposed on an upper surface of the first printed circuit board 410. The cross-sectional area of the second printed circuit board 420 may be formed to be smaller than the cross-sectional area of the first printed circuit board 410.

A secondary metal pattern may be wound on the surface of the second printed circuit board 420. The secondary metal pattern may be wound on a surface of the second printed circuit board 420 in the form of a coil. The secondary metal pattern may be wound in a spiral form on a surface of the second printed circuit board 420.

The second printed circuit board 420 may be formed in multiple layers. The multi-layered second printed circuit board 420 may be stacked in a vertical direction. More specifically, the second printed circuit board 420 disposed on the first printed circuit board 410 may be implemented in two or more sheets. In addition, the secondary metal pattern may be disposed on a surface of each of the second printed circuit boards 420.

When the second printed circuit board 420 is implemented as a multi-layer, a conductor may be connected between the metal patterns disposed on a surface of the second printed circuit board 420 through a through hole.

A third printed circuit board 430 may be disposed on the lower surface of the first printed circuit board 410. The third printed circuit board 430 may be formed to have a cross-sectional area smaller than the cross-sectional area of the first printed circuit board 410.

A secondary metal pattern may be wound on a surface of the third printed circuit board 430. The secondary metal pattern may be wound on a surface of the third printed circuit board 430 in the form of a coil. The secondary metal pattern may be wound in s spiral form on a surface of the third printed circuit board 430.

The third printed circuit board 430 may be formed in multiple layers. The multi-layered third printed circuit board 430 may be stacked in a vertical direction. More specifically, the third printed circuit board 420 disposed on a lower surface of the first printed circuit board 410 may be implemented in two or more sheets. In addition, the secondary metal pattern may be disposed on a surface of each of the third printed circuit boards 430.

When the third printed circuit board 430 is implemented as a multi-layer, the metal patterns disposed on a surface of the third printed circuit board 430 may be connected with a conductor through a through hole.

The second printed circuit board 420 and the third printed circuit board 430 may be disposed to face each other with respect to the first printed circuit board 410.

The core 440 may include an upper core and a lower core.

The upper core may be disposed on an upper surface of the second printed circuit board 420. The upper core may be disposed on a surface of the second printed circuit board 420 to induce the formation of a magnetic field. The upper core may be coupled to surround the secondary metal pattern from the outside.

The lower core may be disposed on a lower surface of the third printed circuit board 430. The lower core may be disposed on a lower surface of the third printed circuit board 430 to induce the formation of a magnetic field. The lower core may be coupled to surround the secondary metal pattern from the outside.

The upper core and the lower core may be ferrite cores.

The first printed circuit board 410, the second printed circuit board 420, and the third printed circuit board 430 may be coupled through a coupling means. In addition, the second printed circuit board 420 and the third printed circuit board 430 may include a coupling portion coupled to the coupling means.

In detail, the first printed circuit board 410, the second printed circuit board 420, and the third printed circuit board 430 may be rivet-coupled to each other. Holes may be formed in the first printed circuit board 410, the second printed circuit board 420, and the third printed circuit board 430 so that a rivet 450 penetrates therethrough, respectively. At an upper end and a lower end of the rivet 450, locking portions 452 and 454 being formed to have a larger cross-sectional area than other areas may be formed so as to be caught on the upper surface of the second printed circuit board 420 and the lower surface of the third printed circuit board 430, respectively. According to the structure as described above, the coupling state of the first printed circuit board 410, the second printed circuit board 420, and the third printed circuit board 430 can be firmly fixed.

In addition, the first printed circuit board 410 and the second printed circuit board 420 and the third printed circuit board 430 may be electrically connected through the rivets 450. In this case, an upper end and a lower end of the rivet 450 may be mounted on a lower surface of the third printed circuit board 430 or an upper surface of the second printed circuit board 420, respectively.

Figure 8:
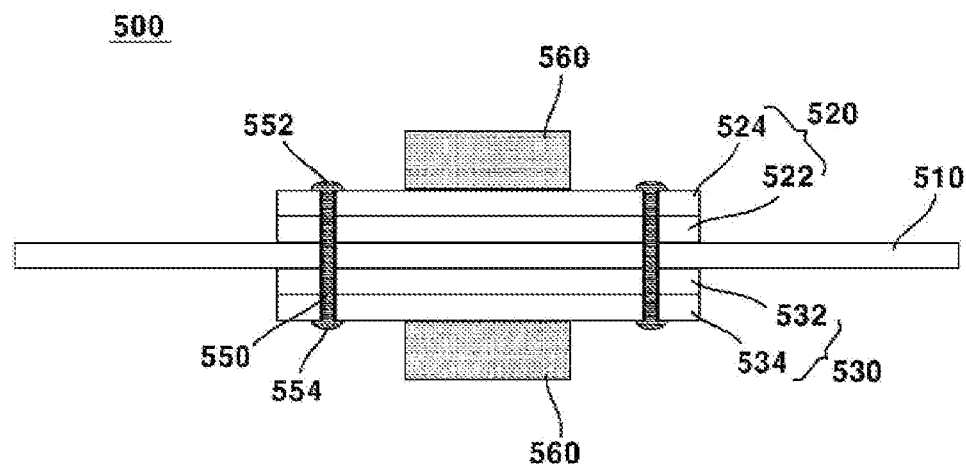
FIG. 8 is a cross-sectional view of a printed circuit board module according to a fifth embodiment of the present invention.

FIG. 8 is a cross-sectional view of a printed circuit board module according to a fifth embodiment of the present invention.

Referring to FIG. 8, the printed circuit board module 500 according to the fifth embodiment of the present invention may comprise a first printed circuit board 510, a second printed circuit board 520, a third printed circuit board 530, and a core 560.

The first printed circuit board 510 may be formed in a plate shape. One or more electronic components for driving may be disposed on an upper surface or a lower surface of the first printed circuit board 510. The electronic components may be provided in plurality and disposed to be spaced apart from each other.

The first printed circuit board 510 is comprised of a double-sided printed circuit board, and the second printed circuit board 520 and the third printed circuit board 530 may be disposed on an upper surface and a lower surface, respectively.

A primary metal pattern (not shown) may be wound on an upper surface or a lower surface of the first printed circuit board 510. The primary metal pattern may be formed in a coil shape on a surface of the printed circuit board 510.

A second printed circuit board 520 may be disposed on an upper surface of the first printed circuit board 510. The cross-sectional area of the second printed circuit board 520 may be formed to be smaller than the cross-sectional area of the first printed circuit board 510.

A secondary metal pattern may be wound on the surface of the second printed circuit board 520. The secondary metal pattern may be wound on a surface of the second printed circuit board 520 in the form of a coil. The secondary metal pattern may be wound in a spiral form on a surface of the second printed circuit board 520.

The second printed circuit board 520 may be formed in multiple layers. The multi-layered second printed circuit board 520 may be stacked in a vertical direction. More specifically, the second printed circuit board 520 disposed on the first printed circuit board 510 may be implemented in two or more sheets. In addition, the secondary metal pattern may be disposed on a surface of each of the second printed circuit boards 520. The second printed circuit board 520 may include a second-first printed circuit board 522 disposed on an upper surface of the first printed circuit board 510 and a second-second printed circuit board 524 disposed on an upper surface of the second-first printed circuit board 522.

When the second printed circuit board 520 is implemented as a multi-layer, a conductor may be connected between the metal patterns disposed on a surface of the second printed circuit board 520 through a through hole.

A third printed circuit board 530 may be disposed on the lower surface of the first printed circuit board 510. The third printed circuit board 530 may be formed to have a cross-sectional area smaller than the cross-sectional area of the first printed circuit board 510.

A secondary metal pattern may be wound on a surface of the third printed circuit board 530. The secondary metal pattern may be wound on a surface of the third printed circuit board 530 in the form of a coil. The secondary metal pattern may be wound in a spiral form on a surface of the third printed circuit board 530.

The third printed circuit board 530 may be formed in multiple layers. The multi-layered third printed circuit board 530 may be stacked in a vertical direction. More specifically, the third printed circuit board 530 disposed on the first printed circuit board 510 may be implemented in two or more sheets. In addition, the secondary metal pattern may be disposed on a surface of each of the third printed circuit boards 530. The third printed circuit board 530 may include a third-first printed circuit board 532 disposed on an upper surface of the first printed circuit board 510 and a third-second printed circuit board 534 disposed on an upper surface of the third-first printed circuit board 532.

When the third printed circuit board 530 is implemented as a multi-layer, a conductor may be connected between the metal patterns disposed on a surface of the third printed circuit board 530 through a through hole.

The second printed circuit board 520 and the third printed circuit board 530 may be disposed to face each other with respect to the first printed circuit board 510.

The core 560 may include an upper core and a lower core.

The upper core may be disposed on an upper surface of the second printed circuit board 520. The upper core may be disposed on a surface of the second printed circuit board 520 to induce the formation of a magnetic field. The upper core may be coupled to surround the secondary metal pattern from the outside.

The lower core may be disposed on a lower surface of the third printed circuit board 530. The lower core may be disposed on a lower surface of the third printed circuit board 530 to induce the formation of a magnetic field. The lower core may be coupled to surround the secondary metal pattern from the outside.

The upper core and the lower core may be ferrite cores.

The first printed circuit board 510, the second printed circuit board 520, and the third printed circuit board 530 may be rivet-coupled to each other. Holes may be formed in the first printed circuit board 510, the second printed circuit board 520, and the third printed circuit board 530 so that a rivet 550 penetrates therethrough, respectively. At the upper and lower ends of the rivet 550, locking portions 552 and 554 being formed to have a larger cross-sectional area than other areas may be formed so as to be caught on the upper surface of the second printed circuit board 520 and the lower surface of the third printed circuit board 530, respectively. According to the structure as described above, the coupling state of the first printed circuit board 510, the second printed circuit board 520, and the third printed circuit board 530 can be firmly fixed.

The rivets 550 may be provided in plurality and disposed to be spaced apart from each other.

In addition, the first printed circuit board 510 and the second printed circuit board 520 and the third printed circuit board 530 may be electrically connected through the rivets 550. In this case, the upper end and lower end of the rivet 550 may be mounted on a lower surface of the third printed circuit board 530 or an upper surface of the second printed circuit board 520, respectively.

Figure 9:
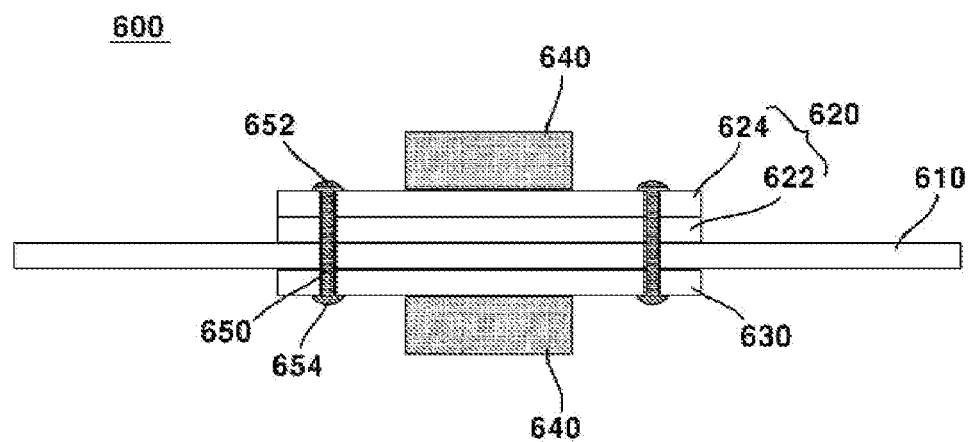
FIG. 9 is a cross-sectional view of a printed circuit board module according to a sixth embodiment of the present invention.

FIG. 9 is a cross-sectional view of a printed circuit board module according to a sixth embodiment of the present invention.

Referring to FIG. 9, the printed circuit board module 600 according to the sixth embodiment of the present invention may comprise a first printed circuit board 610, a second printed circuit board 620, a third printed circuit board 630, and a core 640.

The first printed circuit board 610 may be formed in a plate shape. One or more electronic components for driving may be disposed on an upper surface or a lower surface of the first printed circuit board 610. The electronic components may be provided in plurality and disposed to be spaced apart from each other.

The first printed circuit board 610 is comprised of a double-sided printed circuit board, and the second printed circuit board 620 and the third printed circuit board 630 may be disposed on an upper surface and a lower surface, respectively.

A primary metal pattern (not shown) may be wound on an upper surface or a lower surface of the first printed circuit board 610. The primary metal pattern may be formed in a coil shape on a surface of the printed circuit board 610.

A second printed circuit board 620 may be disposed on an upper surface of the first printed circuit board 610. The cross-sectional area of the second printed circuit board 620 may be formed to be smaller than the cross-sectional area of the first printed circuit board 610.

A secondary metal pattern may be wound on a surface of the second printed circuit board 620. The secondary metal pattern may be wound on a surface of the second printed circuit board 620 in the form of a coil. The secondary metal pattern may be wound in a spiral form on a surface of the second printed circuit board 620.

The second printed circuit board 620 may be formed in multiple layers. The multi-layered second printed circuit board 620 may be stacked in a vertical direction. More specifically, the second printed circuit board 620 disposed on the first printed circuit board 610 may be implemented in two or more sheets. In addition, the secondary metal pattern may be disposed on a surface of each of the second printed circuit boards 620. The second printed circuit board 620 may include a second-first printed circuit board 622 disposed on an upper surface of the first printed circuit board 610 and a second-second printed circuit board 624 disposed on an upper surface of the second-first printed circuit board 622.

When the second printed circuit board 620 is implemented as a multi-layer, a conductor may be connected between the metal patterns disposed on a surface of the second printed circuit board 620 through a through hole.

A third printed circuit board 630 may be disposed on the lower surface of the first printed circuit board 610. The third printed circuit board 630 may be formed to have a cross-sectional area smaller than the cross-sectional area of the first printed circuit board 610.

A secondary metal pattern may be wound on a surface of the third printed circuit board 630. The secondary metal pattern may be wound on a surface of the third printed circuit board 630 in the form of a coil. The secondary metal pattern may be wound in a spiral form on a surface of the third printed circuit board 630.

The third printed circuit board 630 may be formed in multiple layers. The multi-layered third printed circuit board 630 may be stacked in a vertical direction. More specifically, the third printed circuit board 630 disposed on the first printed circuit board 610 may be implemented in two or more sheets. In addition, the secondary metal pattern may be disposed on a surface of each of the third printed circuit boards 630. The number of layers of the third printed circuit board 630 may be smaller than the number of layers of the second printed circuit board 620. For example, the second printed circuit board 620 may be implemented as two sheets, and the third printed circuit board 630 may be implemented as one sheet.

The core 640 may include an upper core and a lower core.

The upper core may be disposed on an upper surface of the second printed circuit board 620. The upper core may be disposed on a surface of the second printed circuit board 620 to induce the formation of a magnetic field. The upper core may be coupled to surround the secondary metal pattern from the outside.

The lower core may be disposed on a lower surface of the third printed circuit board 630. The lower core may be disposed on a lower surface of the third printed circuit board 630 to induce the formation of a magnetic field. The lower core may be coupled to surround the secondary metal pattern from the outside.

The upper core and the lower core may be ferrite cores.

The first printed circuit board 610, the second printed circuit board 620, and the third printed circuit board 630 may be rivet-coupled to each other. Holes may be formed in the first printed circuit board 610, the second printed circuit board 620, and the third printed circuit board 630 so that a rivet 650 penetrates therethrough, respectively. At the upper and lower ends of the rivet 650, locking portions 652 and 654 being formed to have a larger cross-sectional area than other areas may be formed so as to be caught on the upper surface of the second printed circuit board 620 and the lower surface of the third printed circuit board 630, respectively.

According to the structure as described above, the coupling state of the first printed circuit board 610, the second printed circuit board 620, and the third printed circuit board 630 can be firmly fixed.

The rivets 650 may be provided in plurality and disposed to be spaced apart from each other.

In addition, the first printed circuit board 610 and the second printed circuit board 620 and the third printed circuit board 630 may be electrically connected through the rivets 650. In this case, the upper end and lower end of the rivet 650 may be mounted on a lower surface of the third printed circuit board 630 or an upper surface of the second printed circuit board 620, respectively.

FIG. 10 is a cross-sectional view of a printed circuit board module according to a seventh embodiment of the present invention.

Referring to FIG. 10, the printed circuit board module 700 according to the seventh embodiment of the present invention may comprise a first printed circuit board 710, a second printed circuit board 720, a third printed circuit board 730, an upper core 740, and a lower core 750.

The first printed circuit board 710 may be formed in a plate shape. One or more electronic components for driving may be disposed on an upper surface or a lower surface of the first printed circuit board 710. The electronic components may be provided in plurality and disposed to be spaced apart from each other.

The first printed circuit board 710 is comprised of a double-sided printed circuit board, and the second printed circuit board 720 and the third printed circuit board 730 may be disposed on an upper surface and a lower surface, respectively.

A primary metal pattern (not shown) may be wound on an upper surface or a lower surface of the first printed circuit board 710. The primary metal pattern may be formed in a coil shape on a surface of the printed circuit board 710.

A second printed circuit board 720 may be disposed on an upper surface of the first printed circuit board 710. The cross-sectional area of the second printed circuit board 720 may be formed to be smaller than the cross-sectional area of the first printed circuit board 710.

A secondary metal pattern may be wound on a surface of the second printed circuit board 720. The secondary metal pattern may be wound on a surface of the second printed circuit board 720 in the form of a coil.

The second printed circuit board 720 may be formed in multiple layers. The second printed circuit board 720 disposed on the second printed circuit board 720 may be implemented in two or more sheets. In addition, the secondary metal pattern may be disposed on a surface of each of the second printed circuit boards 720.

When the second printed circuit board 720 is implemented as a multi-layer, a conductor may be connected between the metal patterns disposed on a surface of the second printed circuit board 720 through a through hole.

A third printed circuit board 730 may be disposed on the lower surface of the first printed circuit board 710. The third printed circuit board 730 may be formed to have a cross-sectional area smaller than the cross-sectional area of the first printed circuit board 710.

A secondary metal pattern may be wound on a surface of the third printed circuit board 730. The secondary metal pattern may be wound on a surface of the third printed circuit board 730 in the form of a coil.

The second printed circuit board 730 may be formed in multiple layers. The multi-layered second printed circuit board 730 may be stacked in a vertical direction. More specifically, the second printed circuit board 730 disposed on the first printed circuit board 710 may be implemented in two or more sheets. In addition, the secondary metal pattern may be disposed on a surface of each of the second printed circuit boards 730.

When the third printed circuit board 730 is implemented as a multi-layer, a conductor may be connected between the metal patterns disposed on a surface of the third printed circuit board 730 through a through hole.

The core 750 may include an upper core and a lower core.

The upper core may be disposed on an upper surface of the second printed circuit board 720. The upper core may be disposed on a surface of the second printed circuit board 720 to induce the formation of a magnetic field. The upper core may be coupled to surround the secondary metal pattern from the outside.

The lower core may be disposed on a lower surface of the third printed circuit board 730. The lower core may be disposed on a lower surface of the third printed circuit board 730 to induce the formation of a magnetic field. The lower core may be coupled to surround the secondary metal pattern from the outside.

The upper core and the lower core may be ferrite cores.

The upper core and the lower core may be provided in plurality, respectively, and may be disposed to be spaced apart from each other. For example, a first upper core 752 and a second upper core 754 may be disposed on an upper surface of the second printed circuit board 720. In addition, a first lower core 752 and a second lower core 754 may be disposed on a lower surface of the third printed circuit board 730.

Figure 11:
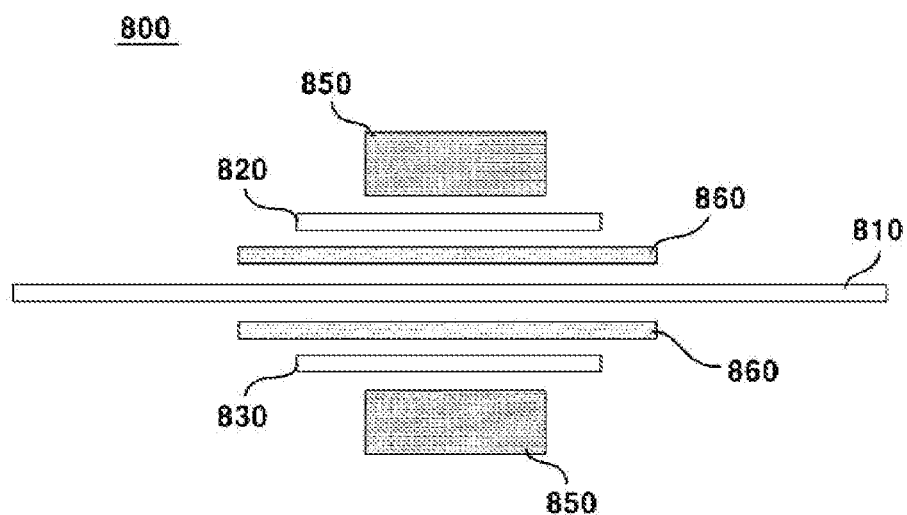
FIG. 11 is a cross-sectional view of a printed circuit board module according to an eighth embodiment of the present invention.

FIG. 11 is a cross-sectional view of a printed circuit board module according to an eighth embodiment of the present invention.

Referring to FIG. 11, the printed circuit board module 800 according to the eighth embodiment of the present invention may comprise a first printed circuit board 810, a second printed circuit board 820, a third printed circuit board 830, insulation layer 860, and a core 750.

The first printed circuit board 810 may be formed in a plate shape. One or more electronic components for driving may be disposed on an upper surface or a lower surface of the first printed circuit board 810. The electronic components may be provided in plurality and disposed to be spaced apart from each other.

The first printed circuit board 810 is composed of a double-sided printed circuit board, and the second printed circuit board 820 and the third printed circuit board 830 may be disposed on an upper surface and a lower surface, respectively.

A primary metal pattern (not shown) may be wound on an upper surface or a lower surface of the first printed circuit board 810. The first metal pattern may be formed in a coil shape on the surface of the first printed circuit board 810.

A second printed circuit board 820 may be disposed on the lower surface of the first printed circuit board 810. The second printed circuit board 820 may be formed to have a cross-sectional area smaller than the cross-sectional area of the first printed circuit board 810.

A secondary metal pattern may be wound on a surface of the second printed circuit board 820. The secondary metal pattern may be wound on a surface of the second printed circuit board 820 in the form of a coil.

The second printed circuit board 820 may be formed in multiple layers. The multi-layered second printed circuit board 820 may be stacked in a vertical direction. More specifically, the second printed circuit board 820 disposed on the first printed circuit board 810 may be implemented in two or more sheets. In addition, the secondary metal pattern may be disposed on a surface of each of the second printed circuit board 820.

When the second printed circuit board 820 is implemented as a multi-layer, a conductor may be connected between the metal patterns disposed on a surface of the second printed circuit board 820 through a through hole.

A third printed circuit board 830 may be disposed on the lower surface of the first printed circuit board 810. The third printed circuit board 830 may be formed to have a cross-sectional area smaller than the cross-sectional area of the first printed circuit board 810.

A secondary metal pattern may be wound on the surface of the third printed circuit board 830. The secondary metal pattern may be wound on the surface of the second printed circuit board 830 in the form of a coil.

The second printed circuit board 830 may be formed in multiple layers. The multi-layered second printed circuit board 830 may be stacked in a vertical direction. More specifically, the second printed circuit board 830 disposed on the first printed circuit board 810 may be implemented in two or more sheets. In addition, the secondary metal pattern may be disposed on a surface of each of the second printed circuit boards 830.

When the third printed circuit board 830 is implemented as a multi-layer, a conductor may be connected between the metal patterns disposed on a surface of the third printed circuit board 830 through a through hole.

The core 750 may include an upper core and a lower core.

The upper core may be disposed on an upper surface of the second printed circuit board 820. The upper core may be disposed on a surface of the second printed circuit board 820 to induce the formation of a magnetic field. The upper core may be coupled to surround the secondary metal pattern from the outside.

The lower core may be disposed on a lower surface of the third printed circuit board 830. The lower core may be disposed on a lower surface of the third printed circuit board 830 to induce the formation of a magnetic field. The lower core may be coupled to surround the secondary metal pattern from the outside.

The upper core and the lower core may be ferrite cores.

The insulation layer 860 can be disposed between the first printed circuit board 810 and the second printed circuit board 820 or between the first printed circuit board 810 and the third printed circuit board 820. The insulation layer 860 may be formed of an insulating material. For example, the insulation layer 810 may be made of a resin or plastic material. Due to this, it is possible to insulate the plurality of printed circuit boards from each other.

Unlike this, the insulation layer 860 may be an air gap that separates the first printed circuit board 810 and the second printed circuit board 820 or the first printed circuit board 810 and the third printed circuit board 820.

Figure 12:
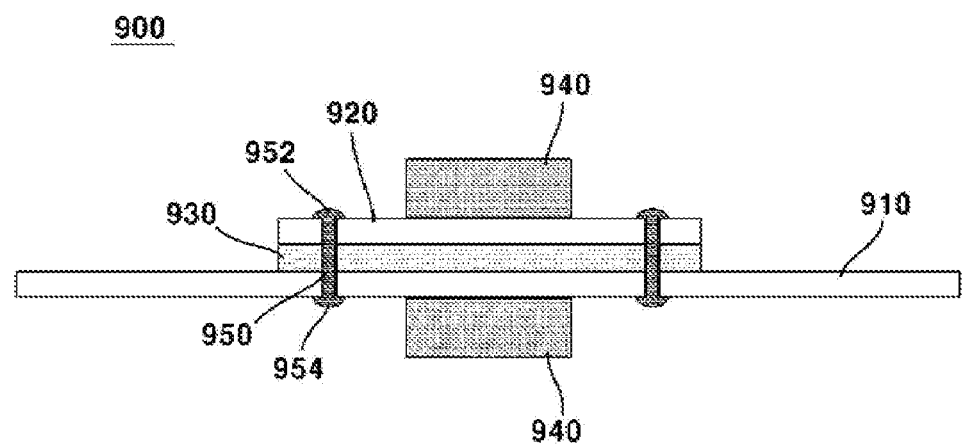
FIG. 12 is a cross-sectional view of a printed circuit board module according to a ninth embodiment of the present invention.

FIG. 12 is a cross-sectional view of a printed circuit board module according to a ninth embodiment of the present invention.

In the present embodiment, the configuration and functions related to the first printed circuit board, the second printed circuit board, the core, and the insulation layer will be referred to the previous embodiment.

Referring to FIG. 12, the printed circuit board module 900 according to the present embodiment may comprise: a first printed circuit board 910, a second printed circuit board 920 disposed on the first printed circuit board 910, an insulation layer 930 disposed between the first printed circuit board 910 and the second printed circuit board 920; and a core 940 disposed on a lower surface of the first printed circuit board 910.

In the present embodiment, the first printed circuit board 910, the insulation layer 930 and the second printed circuit board 920 may be coupled to each other through a rivet 950.

The first printed circuit board 910, the second printed circuit board 920, and the third printed circuit board 930 may be rivet-coupled to each other. Holes may be formed in the first printed circuit board 910, the second printed circuit board 920, and the third printed circuit board 930 so that a rivet 950 penetrates therethrough, respectively. At the upper and lower ends of the rivet 950, locking portions 952 and 954 being formed to have a larger cross-sectional area than other areas may be formed so as to be caught on the upper surface of the second printed circuit board 920 and the lower surface of the third printed circuit board 930, respectively. According to the structure as described above, the coupling state of the first printed circuit board 910, the second printed circuit board 920, and the third printed circuit board 930 can be firmly fixed.

The rivets 950 may be provided in plurality and disposed to be spaced apart from each other.

In addition, the first printed circuit board 910 and the second printed circuit board 920 and the third printed circuit board 930 may be electrically connected through the rivets 950. In this case, the upper end and lower end of the rivet 950 may be mounted on a lower surface of the first printed circuit board 910 or an upper surface of the second printed circuit board 920, respectively.

Figure 13:
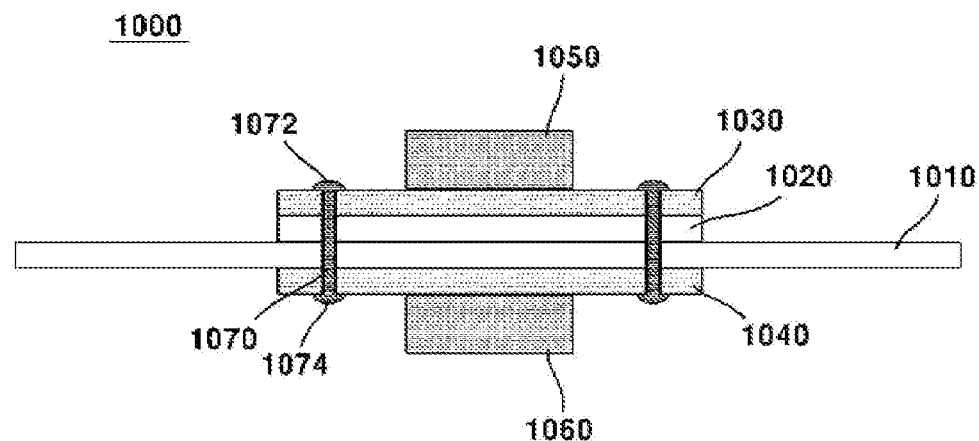
FIG. 13 is a cross-sectional view of a printed circuit board module according to a tenth embodiment of the present invention.

FIG. 13 is a cross-sectional view of a printed circuit board module according to a tenth embodiment of the present invention.

In the present embodiment, the configuration and functions related to the first printed circuit board, the second printed circuit board, the core, and the insulation layer will be referred to the previous embodiment.

Referring to FIG. 13, the printed circuit board module 1000 according to the present embodiment may comprise: a first printed circuit board 1010, a second printed circuit board 1020 disposed on the first printed circuit board 1010, an upper core 1050 disposed at an upper portion of the second printed circuit board 1020; a lower core 1060 disposed at a lower portion of the first printed circuit board 1010; a first insulation layer 1030 disposed between the upper core 1050 and the second printed circuit board 1020; and a second insulation layer 1040 disposed between the first printed circuit board 1010 and the lower core 1060.

The first insulation layer 1030 may be disposed on an upper surface of the second printed circuit board 1020. A cross-sectional shape of the first insulation layer 1030 may correspond to a cross-sectional shape of the second printed circuit board 1020. A cross-sectional shape of the second insulation layer 1040 may correspond to a cross-sectional shape of the first insulation layer 1030.

In the present embodiment, the first printed circuit board 1010, the first insulation layer 1030, the second insulation layer 1040, and the second printed circuit board 1020 may be coupled to each other through a rivet 1070.

Holes may be formed in the first printed circuit board 1010, the second printed circuit board 1020, and the first insulation layer 1030 so that a rivet 1070 penetrates therethrough, respectively. At the upper and lower ends of the rivet 1070, locking portions 1072 and 1074 being formed to have a larger cross-sectional area than other areas may be formed so as to be caught on the upper surface of the first insulation layer 1030 and the lower surface of the second insulation layer 1040, respectively.

Figure 14:
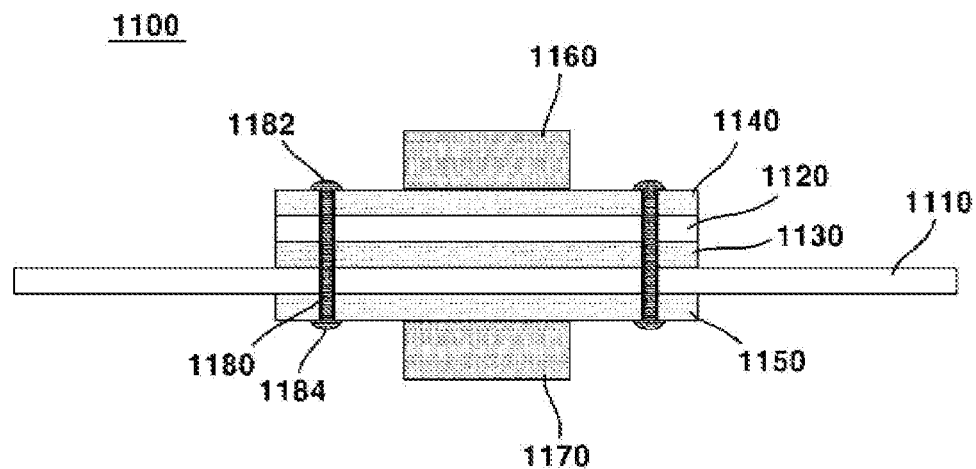
FIG. 14 is a cross-sectional view of a printed circuit board module according to an eleventh embodiment of the present invention.

FIG. 14 is a cross-sectional view of a printed circuit board module according to an eleventh embodiment of the present invention.

In the present embodiment, the configuration and functions related to the first printed circuit board, the second printed circuit board, the core, and the insulation layer will be referred to the previous embodiment.

Referring to FIG. 14, the printed circuit board module 1100 according to the present embodiment may comprise: a first printed circuit board 1110; a second printed circuit board 1120 disposed at an upper portion of the first printed circuit board 1110; an upper core 1160 disposed at a lower portion of the second printed circuit board 1120; a lower core 1170 disposed at a lower portion of the first printed circuit board 1110; a first insulation layer 1130 disposed between the first printed circuit board 1110 and the second printed circuit board 1020; a second insulation layer 1140 disposed between the upper core 1160 and the second printed circuit board 1120; and a third insulation layer 1150 disposed between the first printed circuit board 1110 and the lower core 1170.

The first insulation layer 1130 may be disposed on an upper surface of the first printed circuit board 1110. A cross-sectional shape of the first insulation layer 1130 may correspond to a cross-sectional shape of the second printed circuit board 1120.

The second insulation layer 1140 may be disposed on an upper surface of the second printed circuit board 1120. A cross-sectional shape of the second insulation layer 1140 may correspond to a cross-sectional shape of the first insulation layer 1130.

The third insulation layer 1150 may be disposed on a lower surface of the first printed circuit board 1110. A cross-sectional shape of the third insulation layer 1150 may correspond to a cross-sectional shape of the first insulation layer 1130 or the second insulation layer 1140.

In the present embodiment, the first printed circuit board 1110, the first insulation layer 1130, the second insulation layer 1140, the third insulation layer 1150, and the second printed circuit board 1120 may be coupled to each other through a rivet 1070.

Holes may be formed in the first printed circuit board 1110, the first insulation layer 1130, the second insulation layer 1140, the third insulation layer 1150, and the second printed circuit board 1120 so that a rivet 1180 penetrates therethrough, respectively. At the upper and lower ends of the rivet 1180, locking portions 1182 and 1184 being formed to have a larger cross-sectional area than other areas may be formed so as to be caught on the upper surface of the second insulation layer 1140 and the lower surface of the third insulation layer 1150, respectively.

Figure 15:
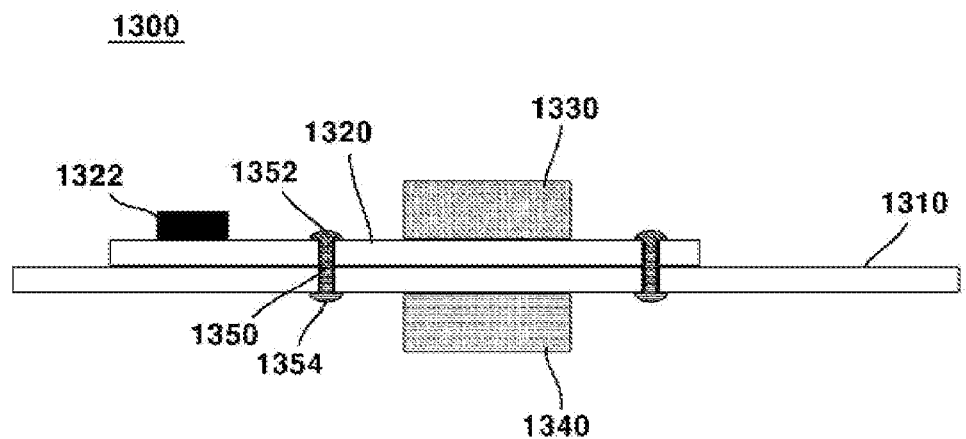
FIG. 15 is a cross-sectional view of a printed circuit board module according to a twelfth embodiment of the present invention.

FIG. 15 is a cross-sectional view of a printed circuit board module according to a twelfth embodiment of the present invention.

In the present embodiment, the configuration and functions related to the first printed circuit board and the second printed circuit board will be referred to the previous embodiments.

The printed circuit board module 1300 according to the present embodiment may comprise: a first printed circuit board 1310; a second printed circuit board 1320 disposed on an upper surface of the first printed circuit board 1310; an upper core 1330 disposed on an upper surface of the second printed circuit board 1320; and a lower core 1340 disposed on a lower surface of the first printed circuit board 1310.

The first printed circuit board 1310 and the second printed circuit board 1320 may be rivet-coupled through a rivet 1350.

In the present embodiment, at least one or more electronic components 1322 for driving may be disposed on the second printed circuit board 1320. The electronic components 1322 may be disposed in an edge region spaced apart from the metal pattern among the outer surface of the second printed circuit board 1320.

Figure 16:
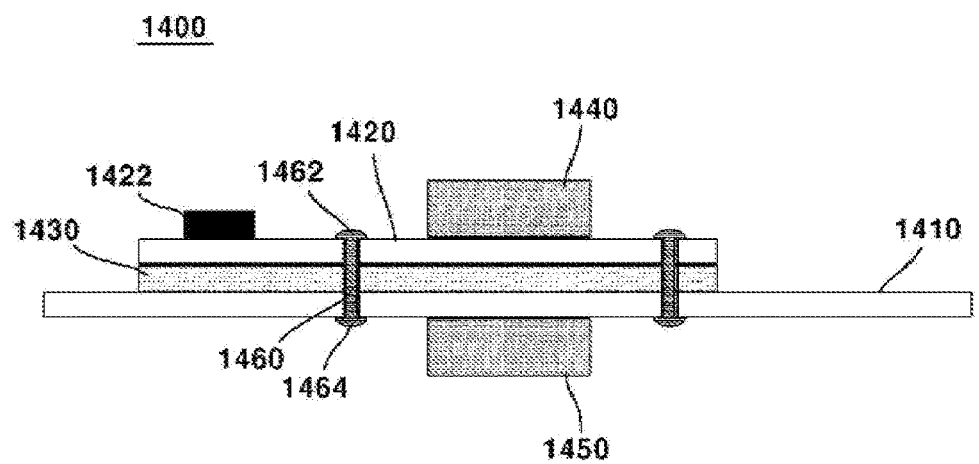
FIG. 16 is a cross-sectional view of a printed circuit board module according to a thirteenth embodiment of the present invention.

FIG. 16 is a cross-sectional view of a printed circuit board module according to a thirteenth embodiment of the present invention.

In the present embodiment, the configuration and functions related to the first printed circuit board and the second printed circuit board will be referred to the previous embodiments.

The printed circuit board module 1400 according to the present embodiment may comprise: a first printed circuit board 1410; a second printed circuit board 1420 disposed at an upper portion of the first printed circuit board 1410; an upper core 1430 disposed on an upper surface of the second printed circuit board 1420; and a lower core 1440 disposed on a lower surface of the first printed circuit board 1410.

In addition, the printed circuit board module 1400 according to the present embodiment being disposed between the first printed circuit board 1410 and the second printed circuit board 1420 may include an insulation layer 1430 for insulating the first printed circuit board 1410 and the second printed circuit board 1420 from each other.

The first printed circuit board 1410, the second printed circuit board 1420, and the insulation layer 1430 may be rivet-coupled through a rivet 1460.

In the present embodiment, at least one or more electronic components 1422 for driving may be disposed on the second printed circuit board 1420. The electronic components 1422 may be disposed in an edge region being spaced apart from the metal pattern on an outer surface of the second printed circuit board 1420.

Figure 17:
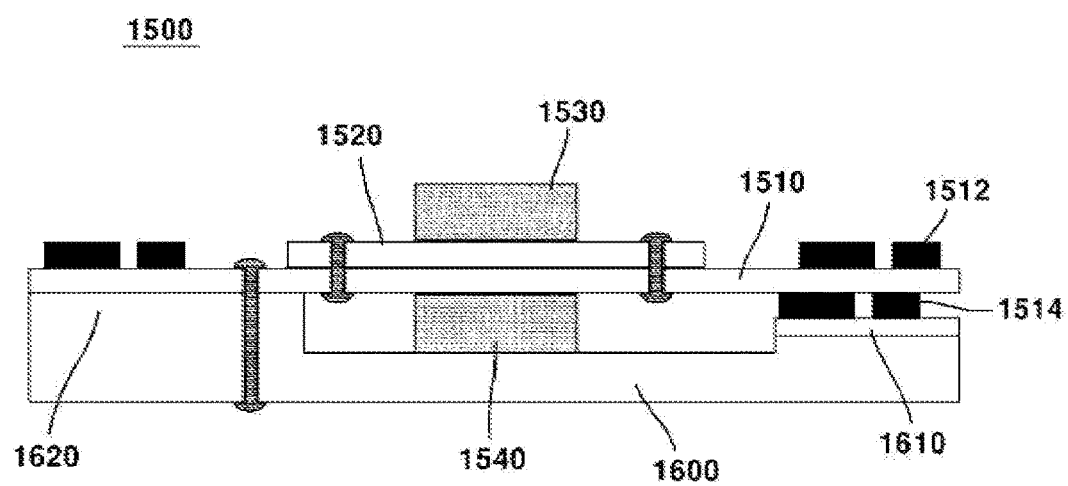
FIG. 17 is a cross-sectional view of a printed circuit board module according to a fourteenth embodiment of the present invention.

FIG. 17 is a cross-sectional view of a printed circuit board module according to a fourteenth embodiment of the present invention.

In the present embodiment, the configuration and functions related to the first printed circuit board and the second printed circuit board will be referred to the previous embodiments.

The printed circuit board 1500 according to the present embodiment may include a first printed circuit board 1510 and a second printed circuit board 1520 disposed on an upper surface of the first printed circuit board 1510. An upper core 1530 and a lower core 1540 may be respectively disposed on an upper surface of the second printed circuit board 1520 and a lower surface of the first printed circuit board 1510.

The first printed circuit board 1510 may be a double-sided printed circuit board. Accordingly, first electronic components 1512 and second electronic components 1514 may be respectively disposed on an upper surface and a lower surface of the first printed circuit board 1510.

The printed circuit board module 1500 according to the present embodiment may be disposed inside the housing.

A protruded portion 1620 for supporting at least a portion of a lower surface of the first printed circuit board 1510 may be formed on an inner surface of the housing. The protruded portion 1620 may be disposed to be protruded inward than other regions of the inner surface of the housing. For example, the upper surface of the protruded portion 1620 may support a lower surface of the first printed circuit board 1510. An upper surface of the protruded portion 1620 may be in contact with a lower surface of the first printed circuit board 1510.

In addition, a heat dissipation pad 1610 may be disposed between the inner surface of the housing and the first electronic components 1512 or between the inner surface of the housing and the second electronic components 1514. One surface of the heat dissipation pad 1610 is in contact with the first electronic components 1512 or the second electronic components 1514, and the other surface is in contact with the inner surface of the housing, so that the heat generated from the first electronic components 1512 or the second electronic components 1514 can be delivered to the housing.

The first printed circuit board 1510 and the second printed circuit board 1520 may be coupled to each other through a rivet. In addition, the first printed circuit board 1510 and the housing may be coupled to each other through a rivet. At this time, at least a portion of the rivet may be disposed to penetrate through the first printed circuit board 1510, and at least another portion of the rivet may penetrate through the housing and protrude to the outside.

Figure 18:
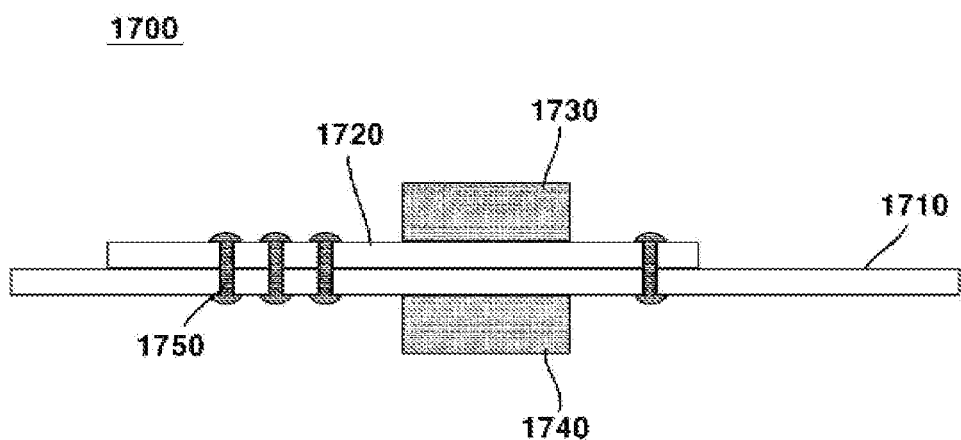
FIG. 18 is a cross-sectional view of a printed circuit board module according to a fifteenth embodiment of the present invention.

FIG. 18 is a cross-sectional view of a printed circuit board module according to a fifteenth embodiment of the present invention.

In the present embodiment, the configuration and functions related to the first printed circuit board, the second printed circuit board, the upper core, and the lower core will be referred to the previous embodiment.

Referring to FIG. 18, a printed circuit board module 1700 according to the present embodiment may comprise: a first printed circuit board 1710, a second printed circuit board 1720 on which the first printed circuit board 1710 is disposed on an upper surface thereof; a lower core 1740 disposed on a lower surface of the first printed circuit board 1710; and an upper core 1730 disposed on an upper surface of the second printed circuit board 1730.

The first printed circuit board 1710 and the second printed circuit board 1720 may be coupled to each other through a rivet 1750. Holes may be formed in the first printed circuit board 1710 and the second printed circuit board 1720 so that the rivet 1750 penetrates therethrough.

The rivets 1750 may be provided in plurality, and may be disposed to be spaced apart from each other. For example, four rivets 1750 may be provided to be spaced apart from each other. As the amount of the rivet 1750 increases, heat generated from the first printed circuit board 1710 and the second printed circuit board 1720 may be easily discharged to the outside.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. A printed circuit board module comprising:
   a first printed circuit board;
   a second printed circuit board disposed on one surface of the first printed circuit board;
   a third printed circuit board disposed on the other surface of the first printed circuit board; and
   a core penetrating through the first to the third printed circuit boards,
   wherein the second printed circuit board includes a first coil,
   wherein the third printed circuit board includes a second coil,
   wherein the cross-sectional area of the second printed circuit board and the third printed circuit board is smaller than the cross-sectional area of the first printed circuit board,
   wherein the first printed circuit board includes a first hole and a second hole into which a portion of the core is being inserted,
   wherein the second printed circuit board is disposed between the first hole and the second hole,
   wherein each of the first printed circuit board, the second ted circuit board, and the third printed circuit board includes a hole,
   wherein a rivet through the hole,
   wherein the first printed circuit board, the second printed circuit board and the third printed circuit board are electrically connected to each other through the rivets, and
   wherein at an upper end and a lower end of the river, engaging portions for engaging the second printed circuit board and the third printed circuit board a respectively disposed.

2. The printed circuit board module according to claim 1, wherein the second printed circuit board and the third printed circuit board have the same area.

3. The printed circuit board module according to claim 1, wherein the first coil includes a plurality of first metal patterns, and
   wherein the second coil includes a plurality of second metal patterns.

4. The printed circuit board module according to claim 3, wherein the first metal pattern includes a primary coil having a first voltage, and
   wherein the second metal pattern includes a secondary coil having a second voltage separated from the primary coil.

5. The printed circuit board module according to claim 1, wherein the core includes a first core and a second core, wherein the first core penetrates through the first printed circuit board, and wherein the second core penetrates through the second printed circuit board.

6. The printed circuit board module according to claim 5, wherein each of the first core and the second core is disposed in plurality.

7. The printed circuit board module according to claim 5, wherein the first core is in contact with an upper surface and a side surface of the second printed circuit board, and wherein the second core is in contact with a lower surface and a side surface of the third printed circuit board.

8. The printed circuit board module according to claim 1, wherein at least one of the second printed circuit board and the third printed circuit board is made of two or more sheets.

9. A printed circuit board module comprising:
a first printed circuit board having a first opening;
a second printed circuit board disposed on one surface of the first printed circuit board and having a second opening;
a third printed circuit board disposed on the other surface of the first printed circuit board and having a third opening; and
a core having at least a portion penetrating through the second opening and the third opening,
wherein the second printed circuit board and the third printed circuit board include a coil,
wherein the length of a long side of the core is longer than the length of at least one side of the second printed circuit board or the third printed circuit board, wherein each of the first printed circuit board, the second printed circuit board, and the third printed circuit board includes a hole, wherein a rivet passes thro the hole, wherein the first printed circuit board, the second printed circuit board and the third printed circuit board are electrically connected to each other through the rivets, and wherein at an upper end and a lower end of the rivet, engaging portions for engaging the second printed circuit board and the third printed circuit board are respectively disposed.

10. The printed circuit board module according to claim 9, wherein the first printed circuit board includes a first hole and a second hole into which a portion of the core is being inserted, and wherein the second printed circuit board is disposed between the first hole and the second hole.

11. The printed circuit board module according to claim 9, wherein the second printed circuit board includes a first coil, wherein the third printed circuit board includes a second coil, wherein the first coil includes a plurality of first metal patterns, and wherein the second coil includes a plurality of second metal patterns.

\* \* \* \* \*